Dec. 7, 1965 G. A. FULLER 3,222,632

PIN AND SOCKET CONNECTOR ASSEMBLY ADAPTED FOR SOLDER CONNECTION

Filed June 8, 1964 2 Sheets-Sheet 1

INVENTOR.
GLENWOOD ARTHUR FULLER
BY Curtis, Morris & Safford

INVENTOR.
GLENWOOD ARTHUR FULLER
BY Curtis, Morris & Safford 3,222,632
PIN AND SOCKET CONNECTOR ASSEMBLY ADAPTED FOR SOLDER CONNECTION Glenwood Arthur Fuller, Hershey, Pa., assignor to AMP Incorporated, Harrisburg, Pa.

Filed June 8, 1964, Ser. No. 373,498
5 Claims. (Cl. 339—256)

This invention relates to a pin and socket construction and technique particularly adapted for use with printed circuit component boards wherein the electrical connection between various sockets and the paths printed on the boards is formed by dip soldering procedures.

In the manufacture of electronic components one frequently employed technique is to mount the various components on an insulating board with the component tips arranged to extend to a side of the board opposite the body of the components. Thereafter, the board surface carrying the component leads extending therethrough is caused to be moved in a plane which traverses a body of liquid and flowing solder which forms small solder droplets on the protrusions represented by the component tips. This serves to mechanically connect the components to the board and to electrically connect the components through their tips to the printed circuit paths on the board.

In an effort to improve the repair and replacement procedures for electronic equipment, experience has developed a need for providing a connection which may be easily broken for those components which have relatively short operational lives. Also, with certain types of test circuits and with analogue type computer equipment, it is necessary to change the components from time to time to provide components of different ratings or values in the circuit.

A specialized pin and socket connector has been developed for accomplishing connections between electronic equipment components which is capable of permitting the components to be connected and disconnected without the need for solder connections being made or broken. An example of this is shown in my copending U.S. patent application, Serial No. 286,725, filed June 10, 1963, entitled, Pin and Socket Connector Assembly. My invention there described includes a connector having a resilient spring member held in a spring housing in the form of an eyelet which is fastened to a printed circuit board. While the assembly of my earlier invention has proven to be quite satisfactory, in many of the uses, for which it is intended, problems have arisen with respect to its use relative to flow solder techniques due to the existence of a small aperture in the lower portion of the spring housing, such aperture permitting solder to flow up into the contact assembly and either jam or cause malfunction of the spring therein. A simple solution to this problem is to cap the end of the spring housing so that solder may not enter into the spring cavity. This solution, however, means that in use axial stacking of boards with common connections is precluded and that in any use the bottom portion of the spring housing must be made relatively long to permit the spring member to expand and to permit the component tip to extend through the spring. An alternative solution has been to leave the sockets out of the board until all dip soldering has been completed to the components which are not meant to be connected by a disconnect type connector, and to add the sockets later and hand solder such to the printed circuit paths. A further solution is to exactly cut the lengths of the component leads to fit when bent into the existing socket lengths.

In general, the foregoing approaches have not proven to be satisfactory and it is an object of the present invention to provide an improved device and technique which permits electronic component boards to be dip soldered with the spring type connectors mounted in the board.

Accordingly, it is one object of the invention to provide an electrical pin and socket connector having means incorporated therein to permit use with dip or flow solder techniques.

It is a further object of the invention to provide an improved pin and socket connector construction which is easier to use by reason of permitting components of nonfixed tip lead lengths to be employed.

It is yet a further object of the invention to provide a pin and socket connector capable of use with dip solder techniques in axially-aligned stacks of printed circuit component boards.

The present invention accomplishes the foregoing objects by providing, in the outer housing of a pin and socket connector, a member which is in place during the dip soldering procedure but which is adapted to be readily displaced by the force of a tool or component tip being inserted within the connector. The member is arranged to be axially aligned with the normal displacement of a component tip lead inserted within the connector and is in various embodiments, a relieved plug, a relieved plug in combination with solder resist and a thinned wall section with a small aperture. The construction of the invention in addition to reducing labor of assembly permits the use of pin and socket type connectors in multiple layers and in axial alignment wherein one lead may be inserted through a number of connectors in common.

Figure 4:
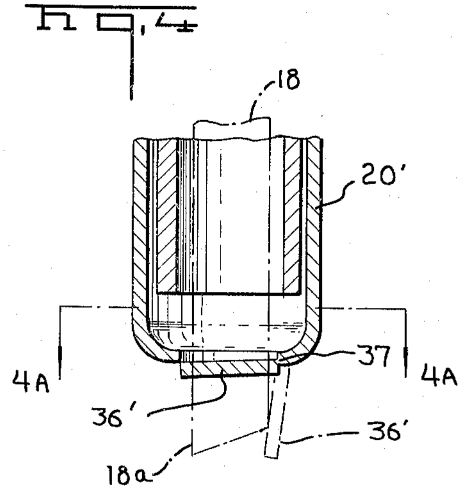
Figure 4A:
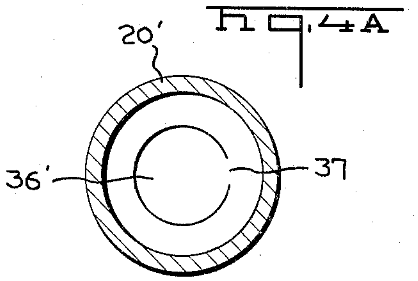
Figures 5, 6:
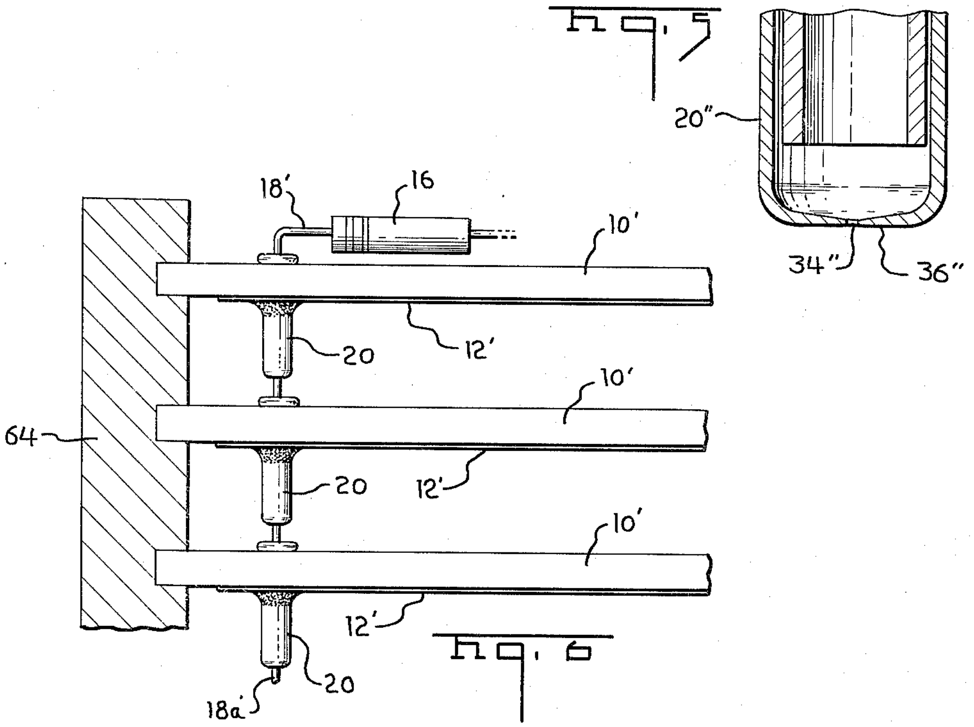

FIGURE 4 in longitudinal section and FIGURE 4A in cross section are of yet a further embodiment of the invention showing the end of a pin and socket connector in section with a knock-out plug being punched in a manner to be retained on the connector housing following knock-out;

FIGURE 5 is a further embodiment of the assembly of the invention showing the end of the connector housing in section and including a very small aperture therein and thinned wall sections as an alternative embodiment; and FIGURE 6 is a sectional view showing three electronic components printed circuit cards mounted such that printed circuit connectors are in alignment to serve in common a single lead from an electronic component terminated to the various component boards.

Figures 1, 2, 3:
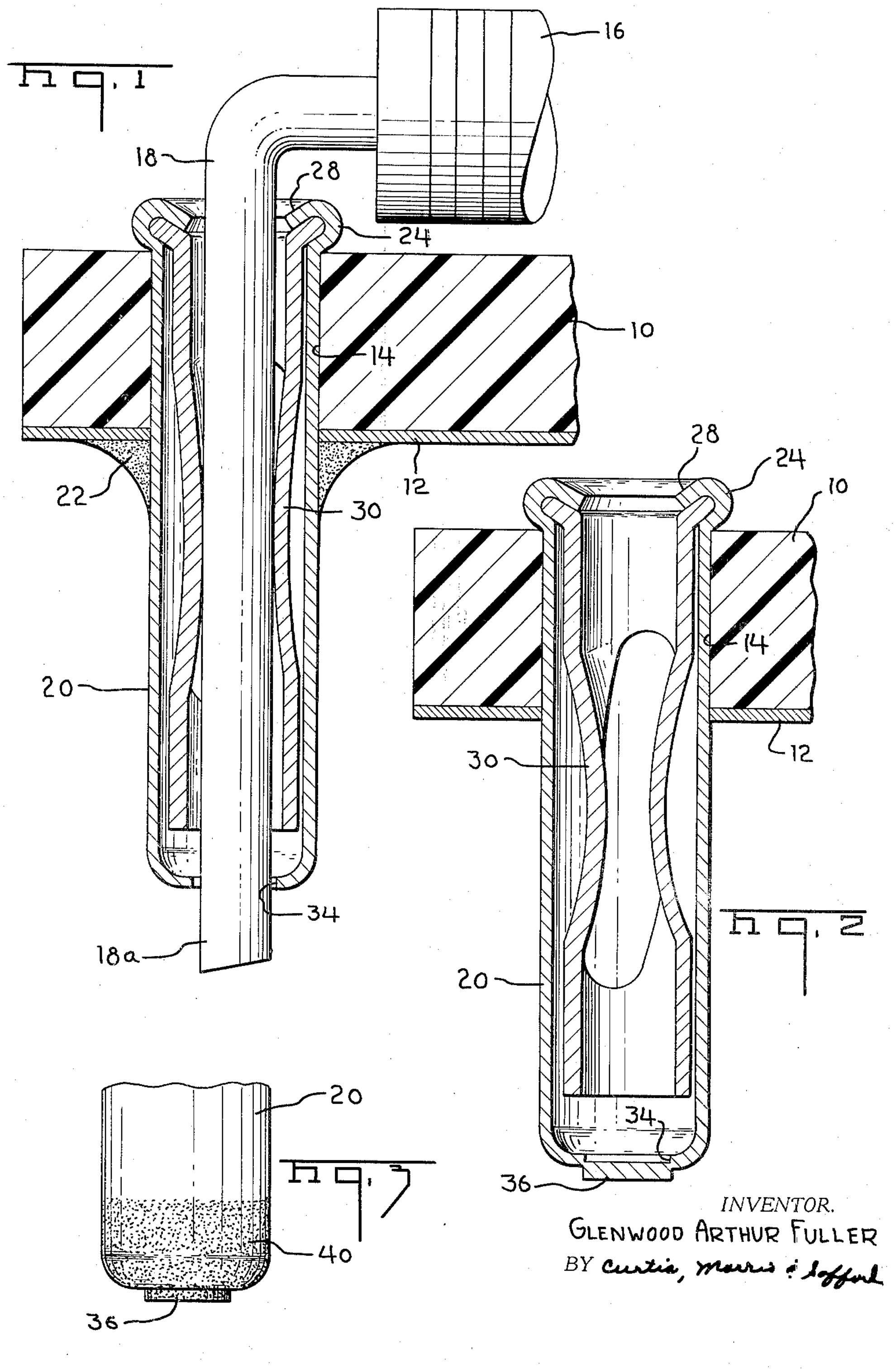
FIGURE 1 is an enlarged view in section of the pin and socket connector of the invention showing a component lead inserted therethrough.
FIGURE 2 is a sectional view similar to FIGURE 1 prior to the soldering operation and prior to the insertion of a component lead therethrough showing the knock-out plug of the invention.
FIGURE 3 is a partial view of the end of the connector of the invention having a solder resist applied thereover as an alternative embodiment.

Referring now to FIGURE 1, the numeral 10 is representative of an insulating board of the type typically used in printed circuit work. Thereon is a representative circuit 12 which may be considered as connected to other fixed or pin and socket type connectors of the type shown. Within the board 10 is an aperture shown as 14 sized to receive in a tight fit a pin and socket connector housing 20 which is connected to the printed circuit path 12 by solder shown as 22. The pin and socket connector is preferably of drawn brass to include a body portion generally of a diameter to fit tightly within 14 and to include an upper portion flared outwardly as at 24 to lock the housing against axial movement downwardly. The portion of the connector housing flared outwardly is then preferably folded inwardly to form a lip as at 28 to grip and hold the spring member shown as 30 within the housing. Reference may be had to my application, Serial No. 286,725, for a description of a spring member suitable for use with the present invention and for the technique of mounting the spring member. In use, it is necessary that the end of the spring member opposite the retention portion entrapped under 28 be left free for a short axial movement such that when the spring is engaged by a component tip lead, it may expand axially. The component 16, through its lead 18, is terminated to spring 30 which is, in turn, connected to housing 20 and thereby to solder 22 and to the printed circuit path 12. As can be seen, there is no particular criticality about the length to which the lead 18 must be cut so long as a sufficient portion is held within the contact pin for proper connection. With the construction in FIGURE 1, then, the end 18*a* may be allowed to protrude through the connector aperture shown as 34.

It is with a construction having an aperture such as 34 above shown that problems were encountered with respect to solder flowing therein to jam the spring member or block the insertion of the component lead 18. FIGURE 2 shows a preferred construction of the pin and socket connection of the invention which is identical to that shown in FIGURE 2 except prior to the time when the dip soldering procedure has taken place and prior to the time when the component has been inserted. The housing 20 includes covering aperture 34 a knock-out plug 36 which is almost severed from the body of housing 20 but is left intact so that there is a thin web of material joining the plug to the remainder of the housing. This construction is preferably achieved during or after the final drawing of the housing portion wherein a mandrel having die surfaces of a diameter of the plug is forced down within the housing against a bottom die limiting the disposition of the plug material so that it is not entirely punched out. It has been found that an almost complete shearing of the material to leave a relatively thin web joining the plug to the housing permits the plug to be knocked out by normal insertion forces accompanying the insertion of a lead such as 18 within the assembly. Depending upon the size and material of the leads to be used, the plug 36 may be relieved about its edges to a greater or lesser extent to thus require more or less insertion force by the component tip or lead inserted therethrough. The important point is that the position of the lug during the dip soldering technique be such as to block the solder from flowing into the housing and fouling either the spring member or the opening.

FIGURE 3 shows an alternative embodiment wherein to the construction shown in FIGURE 2 is added over the tip of a connector housing a solder resist shown generally as 40. This may be W–450 Blue Plating Resist, manufactured by S. C. Robeson, or the equivalent. It has been found that with certain types of solders and with certain dip or solder flow equipments, the addition of the resist is advisable to preclude the collection of solder on the outside of the housing joining the plug 36 to a degree making knock-out difficult.

FIGURES 4 and 4A show yet another alternative embodiment wherein the connector housing shown as 20′ is made to include a plug 36′ which is relieved about the periphery except for one section 37. This construction may be readily accomplished also during the final drawing step by proper dies inserted within the housing and at the outside end to hold the end against complete rupture. With this arrangement, the end of a component tip 18*a* will operate to displace 36′ but due to 37, the plug will be retained on 20′ as indicated by the dotted line portion.

FIGURE 5 shows yet a further alternative wherein the end of the housing shown as 36″ includes thinned sections of material with a very slight pin point aperture 34″ being provided. This construction may also be accomplished during the final drawing process and has been found to assure ease and insertion of the component tip lead. The very small hole left in the end of the housing permits the lead to find a starting point for opening a larger aperture for full insertion within and through the housing. On the other hand, by holding the aperture to an almost pinpoint dimension, no solder will flow into the aperture under normal dip soldering procedures due to surface tension. Any small amount left in 36″ will be easily displaced by normal tip insertion.

In FIGURE 6 there is shown an electronic equipment rack having three circuit boards 10′ mounted such that pin and socket connectors 20 are in axial alignment and adapted to be connected to printed circuit paths 12′ and to receive a common lead 18′ connecting a component 16 to all of the paths 12′. The boards are shown held in one side of a rack 64. With uses of the type shown in FIGURE 6, the advantage of permitting the component lead to extend through the pin and socket connector housing should be apparent.

With the construction of the invention then printed circuit boards may be manufactured with the various pin and sockets inserted along with the components which are to be fixed and the board dip soldered to accomplish the connection between the fixed components, the printed circuit paths and the pin and socket connectors. Thereafter, various components may be inserted with their leads being permitted to pass through and dislodge the plugs of the tips. The circuit boards may be used in multiple with common leads or in single arrays. The construction of FIGURE 2 is preferred for use in single arrays and the constructions of FIGURES 4 and 5 are preferred in instances wherein there is any problem with the plug being dislodged and loose within the circuit. In other words, if the plugs may be removed during assembly, the simpler embodiment is generally preferred and if the installation is blind or into a box where no access may be obtained, the embodiments of FIGURES 4 and 5 may be employed.

Changes in construction will occur to those skilled in the art and various apparently different modifications and embodiments may be made without departing from the scope of the invention. The matter set forth in the foregoing description and accompanying drawings is offered by way of illustration only. The actual scope of the invention is intended to be defined in the following claims when viewed in their proper perspective against the prior art.

What is claimed is:

1. A pin and socket connector for use with printed circuit boards adapted to be dip soldered including a housing member having portions thereon adapted to secure the connector against axial displacement within a printed circuit board, the housing member including a resilient conductive spring member extending therein, said spring member being secured at least one end to the housing against axial displacement and forming with said housing an axial opening adapted to receive the insertion of a component lead through an entry opening into said housing, a portion in the opposite end of said housing effectively closing said end to preclude the flow of solder therein during dip soldering of the device but having an engagement with the housing such that the insertion of a member through said spring member will displace said portion to permit said lead to be inserted in said connector through the opposite end of said housing.

2. The connector of claim 1 wherein said portion is comprised of a plug of material of substantially the wall thickness of said housing with the peripheral portions thereof joined to said housing by a relatively thin web.

3. The connector of claim 2 wherein said peripheral portions extend about all but a small section of said plug which section is relatively thicker than said web.

4. The connector of claim 1 wherein there is included a solder resist over the outside surfaces of the connector housing opposite end.

5. A connector of the pin and socket type adapted for use with dip solder techniques including a housing member housing a resilient spring member and adapted to receive a component lead inserted therein, the said housing having disposed at one end an opening for said lead and at the other end a relieved portion adapted to preclude the entry of solder within said housing but sufficiently weakened to permit a component lead to be inserted therethrough under nominal insertion forces.

References Cited by the Examiner

UNITED STATES PATENTS

| | | | |
|---|---|---|---|
| 2,969,517 | 1/1961 | Gluck | 339—17 |
| 3,163,709 | 12/1964 | Fox | 339—275 X |

FOREIGN PATENTS

| | | |
|---|---|---|
| 917,405 | 2/1963 | Great Britain. |

JOSEPH D. SEERS, *Primary Examiner.*